United States Patent [19]
Van Heelsbergen

[11] Patent Number: 4,788,503
[45] Date of Patent: Nov. 29, 1988

[54] MAGNETIC RESONANCE IMAGING APPARATUS HAVING A DETUNED RF COIL

[75] Inventor: Teunis R. Van Heelsbergen, Eindhoven, Netherlands

[73] Assignee: U.S. Philips Corporation, New York, N.Y.

[21] Appl. No.: 59,283

[22] Filed: Jun. 8, 1987

[30] Foreign Application Priority Data

Dec. 22, 1986 [NL] Netherlands ............... 8603252

[51] Int. Cl.⁴ .......................................... G01R 33/20
[52] U.S. Cl. ..................................... 324/322; 324/318
[58] Field of Search ............... 324/300, 307, 309, 318, 324/319, 322

[56] References Cited

U.S. PATENT DOCUMENTS

| | | | |
|---|---|---|---|
| 4,517,516 | 5/1985 | Hill | 324/318 |
| 4,612,505 | 9/1986 | Zijlstra | 324/318 |
| 4,638,253 | 1/1987 | Jaskolski | 324/318 |
| 4,641,097 | 2/1987 | Bottomley | 324/318 |
| 4,649,348 | 3/1987 | Flugan | 324/318 |
| 4,691,163 | 9/1987 | Blass | 324/318 |
| 4,692,705 | 9/1987 | Hayes | 324/318 |

*Primary Examiner*—Michael J. Tokar
*Attorney, Agent, or Firm*—Algy Tamoshunas; William J. Street; Jack E. Haken

[57] ABSTRACT

In magnetic resonance imaging apparatus in which bird-cage coils are used in combination with other coils, a capacitance is bridged by means of an inductive element. Substantial detuning and hence adequate uncoupling of the bird-cage coil from the other (receiving) coil is achieved. Use can be made of the already present coaxial transmission line via which the RF energy is applied to the bird-cage coil. Connecting the core and the jacket of the coaxial transmission line there is arranged a diode switch so that the bird-cage coil circuit can be electronically detuned, thus enabling fast switching on and off of the bird-cage coil.

8 Claims, 2 Drawing Sheets

MAGNETIC RESONANCE IMAGING APPARATUS HAVING A DETUNED RF COIL

BACKGROUND OF THE INVENTION

1. Field of the Invention

The invention relates to a magnetic resonance imaging apparatus comprising a substantially cylindrical RF coil in which a substantially cosinusoidal current distribution can be generated across a circular-cylindrical circumference by means of a number of rod conductors, extending axially across the cylindrical surface, in cooperation with a number of capacitances. An RF coil for a magnetic resonance imaging apparatus of this kind is known from U.S. Pat. No. 4,339,718 and is based on the well-established fact that a uniform field distribution in such a coil necessitates a cosinusoidal current distribution across the circumference of the cylindrical coil. Coils of this kind are also referred to as "bird-cage" coils and various constructions are available for such magnetic resonance imaging apparatus.

2. Description of the Prior Art

One embodiment of the bird-cage coil serves to generate and detect an RF field for generating and measuring magnetic resonance signals in a region of a body of a patient. Bird-cage coils of this kind are often used in conjunction with a further coil, for example a surface coil, the bird-cage coil then being used for generating an RF field while the surface coil is used for detecting the magnetic resonance signals generated by means of the RF field. Because the frequency of the RF field and of the magnetic resonance signals is the same, the surface coil will interfere with the bird-cage coil during the generating of the RF field, and the bird-cage coil will interfere with the surface coil during the detection of the magnetic resonance signals.

Therefore, one coil must be detuned or deactivated when the other coil is active, and vice versa, in order to prevent undesirable mutual influencing. It is known that a resonance circuit can be detuned by short-circuiting a capacitance. This principle could also be used in the bird-cage coil. However, such a coil consists of a series connection of coils and capacitances. When a capacitance is short-circuited in only one location, the detuning of the bird-cage coil will be so slight that the uncoupling from the surface coil will be insufficient. An obvious solution to this problem would be the short-circuiting of the capacitances in many locations. However, this solution is comparatively complex from a technical point of view and also leads to an undesirable deterioration of the coil quality.

SUMMARY OF THE INVENTION

The invention has for its object to provide a magnetic resonance imaging apparatus which includes a bird-cage coil which can be simply detuned. To achieve this, a magnetic resonance imaging apparatus in accordance with the invention is characterized in that a capacitance of the coil can be bridged by means of an inductive element. In a magnetic resonance imaging apparatus in accordance with the invention, in which merely a capacitance is bridged by means of an inductive element, the bird-cage coil is detuned to such an extent that adequate uncoupling between the said coils is achieved.

A preferred embodiment of a magnetic resonance imaging apparatus in accordance with the invention is characterized in that the inductive element is formed by a transmission line which is suitable for radio frequencies, at one end of the transmission line a first and a second conductor being connected to the one side and the other side of the capacitance, respectively, it being possible to form a short-circuit between the two conductors at the other end by means of a switch. In the preferred embodiment of the apparatus in accordance with the invention, the inductive element is formed by a transmission line which is suitable for radio frequencies, for example a coaxial cable. The conductive core and the jacket of the cable are then connected to the one side and the other side, respectively, of a capacitance to be bridged. To the other end of the transmission line there is connected a diode bridge switch which is capable of connecting the core to the jacket. This simple method of detuning the bird-cage coil enables activation and deactivation of the detuning by means of an electronic semi-conductor switch. It is an important aspect of this solution that the quality of the RF coil is not affected.

A further embodiment of a magnetic resonance imaging apparatus in accordance with the invention is characterized in that the RF energy is applied via the transmission line.

BRIEF DESCRIPTION OF THE DRAWING

The invention will be described in detail hereinafter with reference to the accompanying drawing wherein.

Figure 1:
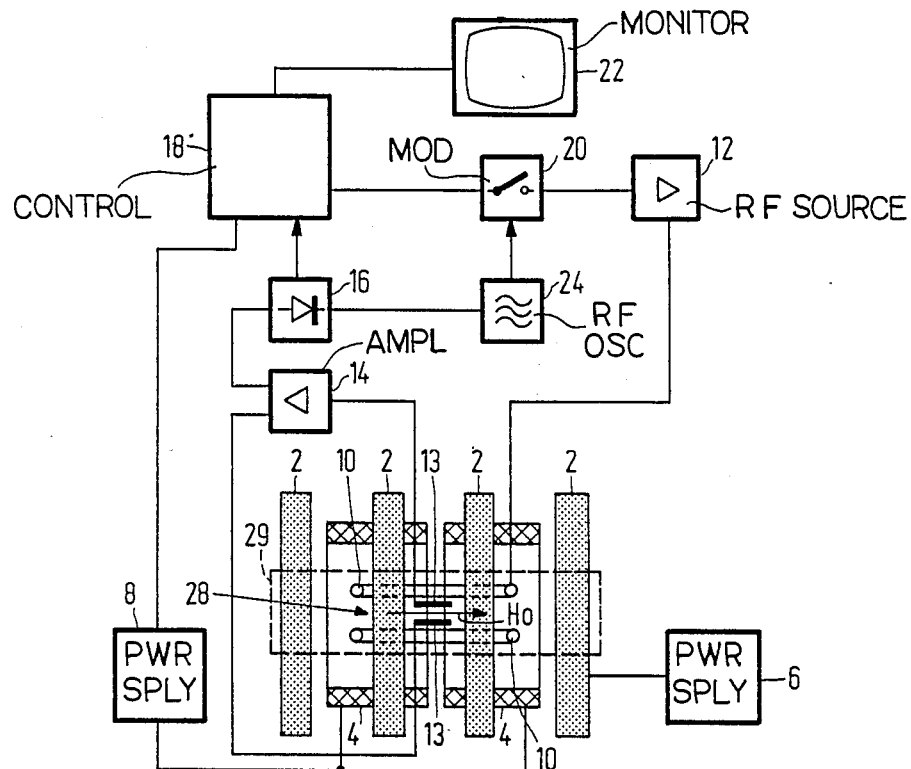
FIG. 1 shows a magnetic resonance imaging apparatus in accordance with the invention.

A magnetic resonance imaging apparatus as shown in FIG. 1 comprises a magnet system 2 for generating a steady, magnetic field HO, a magnet system 4 for generating magnetic gradient fields, and power supply sources 6 and 8 for the magnet system 2 and the magnet system 4, respectively. An RF magnet coil 10 serves for generating an RF magnetic alternating field, for which purpose it is connected to an RF source 12. For the detection of the resonance signal generated in an object to be examined by the transmitted RF field, use is made of an RF receiving coil 13 (for example, a surface coil), for which purpose this coil is connected to a signal amplifier 14. The signal amplifier 14 is connected to a phase-sensitive rectifier 16 which is connected to a central control device 18. The central control device 18 also controls a modulator 20 for the RF source 12, the supply source 8 for the gradient coils, and a monitor 22 for display. An RF oscillator 24 controls the modulator 20 as well as the phase-sensitive rectifier 16 which processes the measurement signals. The transmitter coil 10, arranged within the magnet systems 2 and 4, encloses a measurement space 28 which is spacious enough to accommodate a patient to be examined in the case of a medical diagnostic apparatus. A steady magnetic field HO, gradient fields for selecting object slices, and a spatially uniform RF alternating field can thus be generated within the measurment space 28. After the generating of an RF magnetic field, it will be necessary to deactivate the RF coil 10 quickly, because subsequently the resonance signal generated must be detected by means of the receiver coil 13. The RF coil 10 should be deactivated so as not to interfere with the detection of the resonance signals by the receiver coil 13.

Figure 2:
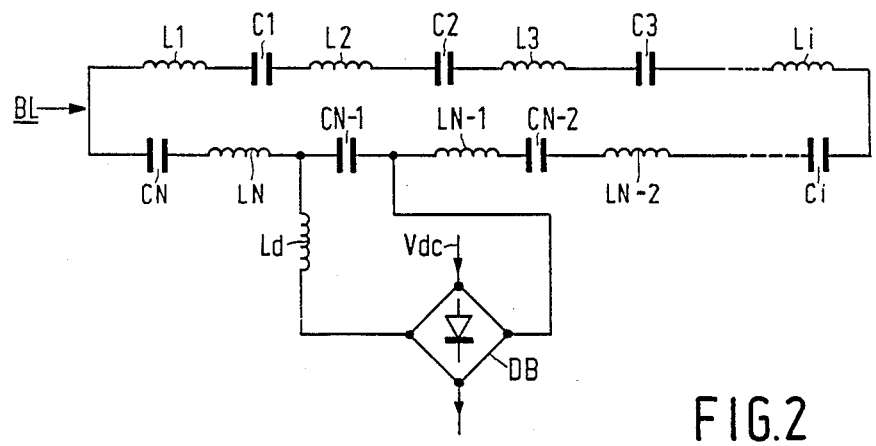
FIG. 2 shows a circuit diagram of an RF coil to be detuned in accordance with the invention.

Therefore, in order to satisfy the above requirement, one of the capacitances of the bird-cage coil is bridged by means of an inductive element. This inductive element can be switched on and off by means of electronic switching means. FIG. 2 illustrates the principle of a bird-cage coil BL in accordance with the invention. The bird-cage coil is in principle formed by a series network comprising coils L1, ... Li, ... LN and capacitances C1, ... Ci, ... CN as diagrammatically shown in FIG. 2. FIG. 2 also shows that the capacitance CN-1 can be bridged by means of an inductive element Ld which is connected in series with a diode switch DB. This diode switch can be quickly switched on and off by way of a voltage Vdc to be applied thereto, so that the coil BL shown in FIG. 2 can be quickly switched off after having generated an RF magnetic field. The semiconductor switch DB shown in FIG. 2 may be a diode bridge switch comprising PIN diodes, but may also be formed by a series connection of some PIN semiconductor diodes.

Figure 3:
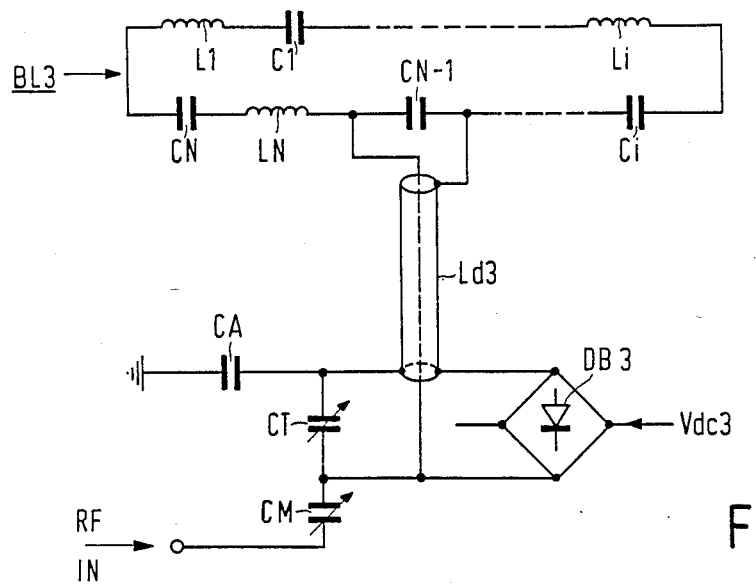
FIG. 3 shows a practical embodiment of an RF coil in accordance with the invention.

FIG. 3 shows a practical embodiment of the bird-cage coil BL3, comprising an inductive element Ld3 and a switch DB3 for a magnetic resonance imaging apparatus in accordance with the invention. As appears from FIG. 3, the capacitance CN-1 to be bridged is connected on the one side to the core of an RF transmission line Ld3, and the other side of the capacitance CN-1 is connected to the jacket thereof. At the other end of the transmission line Ld3 a diode bridge switch DB3 is connected between its core and its jacket. The diode bridge switch DB3 can be made conductive or can be interrupted by application of a suitable voltage Vdc3 between its other two terminals, which means that in the former case the transmission line bridges the capacitance CN-1 whilst in the latter case it serves as a supply lead for RF power which is applied to the core via a capacitance CM. Furthermore, the diode bridge DB3 is connected parallel to a capacitance CT and the jacket is grounded via a further capacitance CA. The capacitance CT is used for tuning the assembly to the desired resonant frequency when the diode bridge circuit DB3 is not short-circuited. The RF energy is applied via a capacitance CM in order to match the impedance of the circuit shown in FIG. 3 to the output impedance of the RF transmitter 12 (FIG. 1), thus ensuring that no reflections occur.

Figure 4:
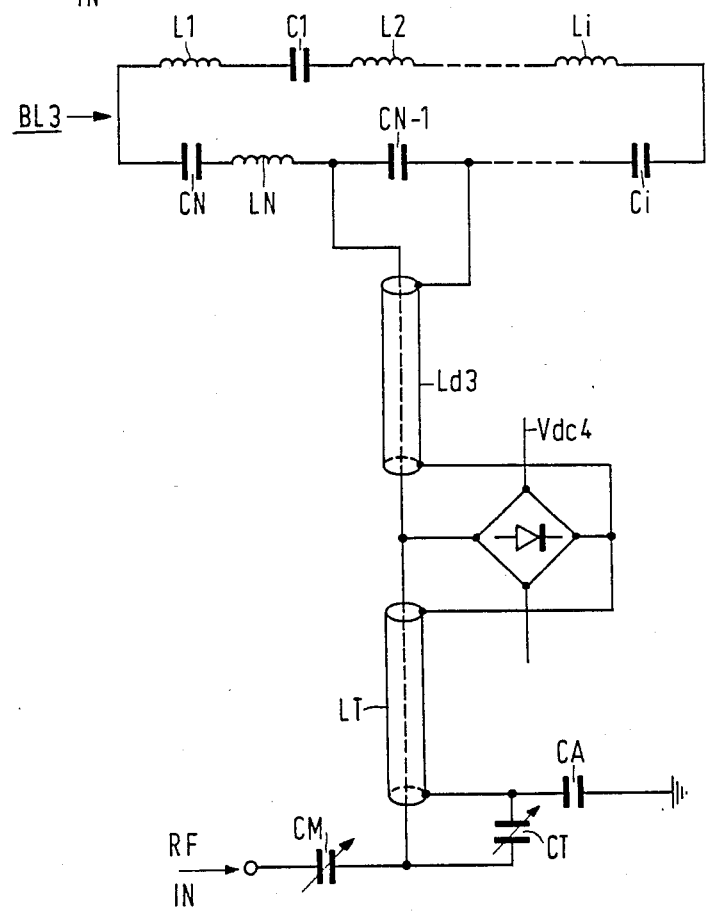
FIG. 4 shows a further embodiment of an RF coil in accordance with the invention.

FIG. 4 shows an alternative version of the practical embodiment shown in FIG. 3. The components in FIG. 4 whose function and use are identical to those of the components shown in FIG. 3 are denoted by corresponding reference numerals. However, in FIG. 4 the diode bridge DB3 is connected to a further transmission line LT via which the RF energy is applied. The end of this transmission line LT is connected to the tuning capacitor CT which connects the core of the coaxial cable LT to its jacket. Furthermore, the jacket of this coaxial cable LT is connected to ground via a capacitance CA, and the RF energy is applied to the core of the coaxial cable LT via a matching capacitance CM, the other side of which forms the input.

What is claimed is:

1. In a magnetic resonance imaging apparatus having first coil means for generating RF fields and second coil means for detecting magnetic resonance signals, said first coil means having a series connection of a plurality of coils and a plurality of capacitors, means for decoupling said first coil means from said second coil means comprising an inductive element connected through an electronic switch to bridge one of said capacitors.

2. The invention according to claim 1 wherein said electronic switch comprises a plurality of PIN diodes.

3. The invention according to claim 2 wherein said plurality of PIN diodes are connected as a bridge switch.

4. The invention according to claim 1 wherein said inductive element comprises a transmission line.

5. The invention according to claim 4 wherein said transmission line has a first conductor and a second conductor, and a first end and a second end, and wherein at said first end of said transmission line said first and said second conductor are connected to one side and to the other side of said one capacitor, respectively, and at said second end of said transmission line said electronic switch is connected between said first conductor and said second conductor.

6. The invention according to claim 5 wherein said electronic switch comprises a plurality of PIN diodes.

7. The invention according to claim 6 wherein said plurality of PIN diodes are connected as a bridge switch.

8. The invention according to claim 5 wherein said transmission line is a coaxial cable.

* * * * *